United States Patent [19]

Ozaki

[11] Patent Number: 4,948,743

[45] Date of Patent: Aug. 14, 1990

[54] METHOD OF MANUFACTURING A SEMICONDUCTOR DEVICE

[75] Inventor: Hideto Ozaki, Kyoto, Japan

[73] Assignee: Matsushita Electronics Corporation, Osaka, Japan

[21] Appl. No.: 373,102

[22] Filed: Jun. 29, 1989

[30] Foreign Application Priority Data

Jun. 29, 1988 [JP] Japan .................................. 63-161751
Jul. 14, 1988 [JP] Japan .................................. 63-175975

[51] Int. Cl.[5] .................... H01L 21/31; H01L 21/88
[52] U.S. Cl. .................................... 437/40; 437/41; 437/228; 437/235; 437/982; 148/DIG. 133
[58] Field of Search ............... 437/40, 41, 42, 43, 437/44, 45, 193, 194, 228, 235, 236, 189, 982, 247; 148/DIG. 133

[56] References Cited

U.S. PATENT DOCUMENTS

| | | | |
|---|---|---|---|
| 3,825,442 | 7/1974 | Moore | 148/DIG. 133 |
| 4,104,784 | 8/1978 | Klein | 437/228 |
| 4,733,291 | 3/1988 | Levy et al. | 148/DIG. 133 |

FOREIGN PATENT DOCUMENTS

| | | | |
|---|---|---|---|
| 0055375 | 5/1979 | Japan | 437/982 |
| 0120149 | 9/1980 | Japan | 437/41 |
| 0002654 | 1/1981 | Japan | 437/189 |
| 0066651 | 4/1982 | Japan | 437/982 |
| 0159544 | 7/1984 | Japan | 437/235 |
| 0142543 | 7/1985 | Japan | 148/DIG. 133 |

Primary Examiner—Brian E. Hearn
Assistant Examiner—Tuan Nguyen
Attorney, Agent, or Firm—Wenderoth, Lind & Ponack

[57] ABSTRACT

A method of manufacturing a semiconductor device, includes the following steps: part of an insulation film is left on the bottom of a contact hole of the insulation film formed on a semiconductor substrate or a separate insulation film is otherwise formed, under which condition a satisfactory slope is formed on the peripheral edge and the side wall of the contact hold by providing the semiconductor substrate with a heat treatment. According to the present invention, it is possible thereafter to improve the step coverage of a metal interconnection to be formed on the surface of the insulation film and to prevent breakage of the metal interconnection, thereby substantially improving the reliability of the resulting semiconductor device.

5 Claims, 5 Drawing Sheets

FIG. IA
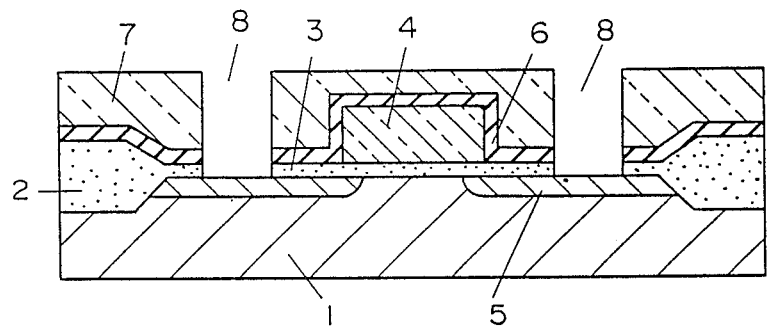
FIG. IB
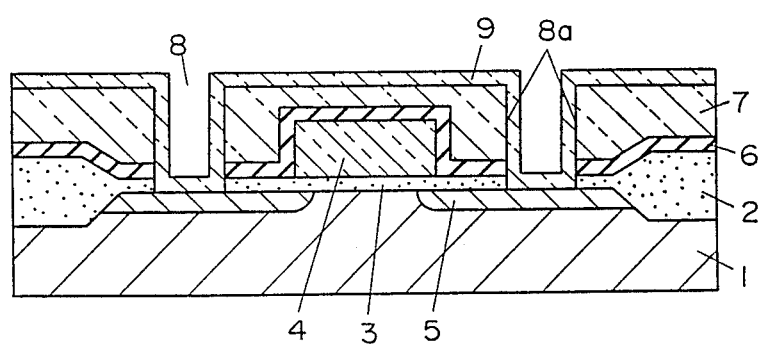
FIG. IC
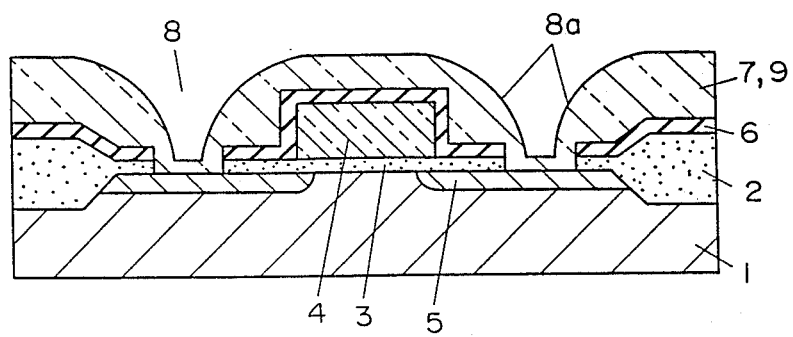

METHOD OF MANUFACTURING A SEMICONDUCTOR DEVICE

BACKGROUND OF THE INVENTION

The invention relates to a method of manufacturing a semiconductor device suitable for obtaining multilayer wiring.

In a VLSI process, borophosphosilicate glass (hereafter abbreviated as a BPSG film) is utilized for an inter layer dielectric film of a multi-level metallization. When using the BPSG film as the layer insulation film, the BPSG film is normally passed through two high temperature processes (flow process and reflow process) to level the unevenness of a lower wiring or to slope a contact hole.

The manufacturing method employed conventionally of the MOS type semiconductor device using the flow process and the reflow process of the BPSF film will be explained by referring to the process charts a through c of FIG. 3. In this manufacturing method, on one main side of a silicon substrate 21 are formed a selective oxidized film 22 (LOCOS0, a gate oxidized film 23, a polycrystal silicon gate 24, and a diffusion layer 25, and further a silicon nitride film 26 is heaped all over the surface of the substrate. Then, the BPSG film 27 of 3 weight percentage of boron concentration and 4 weight percentage of phosphorus concentration is heaped on the substrate, and then, in order to flatten the surface of the BPSG film 27, the substrate is heat treated (flow process) in oxygen at 900° C. for 60 Minutes. Following the heat treatment, a contact hole 28 is formed in the BPSG film 27 and the silicon nitride film 26 (FIG. 3, a). Then, the substrate is heat treated (reflow process) in nitrogen at 900° C. for 30 minutes. By this heat treatment, a shape 28a of the step saction of the contact hole 28, which was steep after the above heat treatment, was made round (FIG. 3, b).

Finally the MOS type transistor is completed by forming an aluminum interconnection 30 as the upper wiring (FIG. 3, c).

However, in this case, an overhang is formed on the side wall section of the contact hole 28 during the heat treatment of the reflow process, by a fine contact hole 28 formed in the BPSG film 27. The step coverage of the aluminum interconnection 30 in the contact hole is caused to become worse by this overhang, leading to possible trouble of breakage of the conductor or of electromigration.

The overhang of the contact hole can be alleviated by reducing the boron concentration or phosphorus concentration of the BPSG film 27 and controlling the extent of the reflow process, but in this case, the BPSG film 27 cannot be flattened sufficiently during the flow process. On the other hand, if the heat treatment temperature of the reflow process lowered or if the time for heat treatment is shortened to control the overhand of the BPSG film 27, it is not possible to form a roundness or a slope at the peripheral edge 28a of the contact hole 28, and the step coverage of the aluminum interconnection 30 cannot be improved.

SUMMARY OF THE INVENTION

It is an object of the present invention to provide a method of manufacturing a semiconductor device whereby a good slope is formed on the peripheral edge and the side wall of the contact hole formed in the insulation layer and the step coverage of aluminum interconnection is improved.

To summarize the above, the characteristic of the manufacturing method of the present invention is to form an insulation layer on the inner surface of the contact hole or to leave an insulation layer on the bottom of the contact hole, and then to provide heat treatment (reflow process) with the substrate, thereby providing a slope at the peripheral edge of the contact hole.

According to the manufacturing method of the present invention, it becomes possible to form a slope which is suitable for the contact hole of a high aspect ratio.

BRIEF DESCRIPTION OF THE DRAWINGS

FIGS. 1a-1e are cross-sectional views of the process showing the manufacturing method of the semiconductor device of a first embodiment of the present invention;

DETAILED DESCRIPTION OF THE INVENTION

Figure 1D:
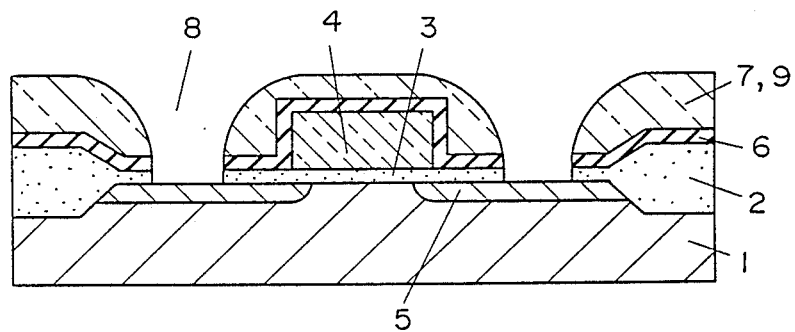

By way of example and to make the description more clear, reference is made to the drawing of the first embodiment of the manufacturing method of the semiconductor device of the present invention. FIGS. 1a-1c show the manufacturing process drawings of a MOS type integrated circuit, in which one MOS type transistor section is enlarged simply and plainly.

With the manufacturing method of the present invention as well, on one main side of a silicon substrate 1 are formed a MOS type element comprising a selective oxidized film (LOCOS) 2, a gate oxidized film 3, a polycrystal silicon gate layer 4, and a diffusion layer 5, and then silicon nitride film 6 is heaped all over the surface of the substrate. Next, a first BPSG film 7 of 3 weight percentage of boron concentration and 4 weight percentage of phosphorus concentration, for example, is heaped on the substrate and heat treated flow process in oxygen for example at 900° C. for 60 minutes in order to flatten the surface of the first BPSG film 7. Following the heat treatment, the first BPSG film 7 is dry-etched by using patterned resist as a mask, and thereby, a contact hole 8 is formed in the first BPSG film 7 and the silicon nitride film 6. (see FIG. 1a).

Then, after removing the resist, 150 nm of a second BPSG film 9 of 4 weight percentage of boron concentration and 2 weight percentage of phosphorus concentration, for example, is heaped on the substrate. The second BPSG film 9 is formed along the surface of the shape of the substrate. (see FIG. 1b). Then, the substrate is heat treated (reflow process) in nitrogen at 900° C. for 30 minutes. In this process, the first and second BPSG films 7, 9 are melted and a slope is formed on the side wall and peripheral edge 8a of the contact hole 8. FIG. 1c shows the shape after the reflow process has been provided. That the tapered slope is formed in the contact hole by this reflow process is considered because the second BPSG film 9 fills the overhang of the first BPSG film 7. As with the conventional method wherein only the first BPSG film 7 is used, interfacial tension works on the bottom of the contact hole and the first BPSG film 7, and thereby an overhang is formed. The second BPSG film 9 has an effect to reduce this interfacial tension.

Next, the second BPSG film 9 on the bottom of the contact hole 8 is dry-etched (CHF$_3$, O$_2$) anisotropically for about one minute and is removed (see FIG. 1d).

Figure 1E:
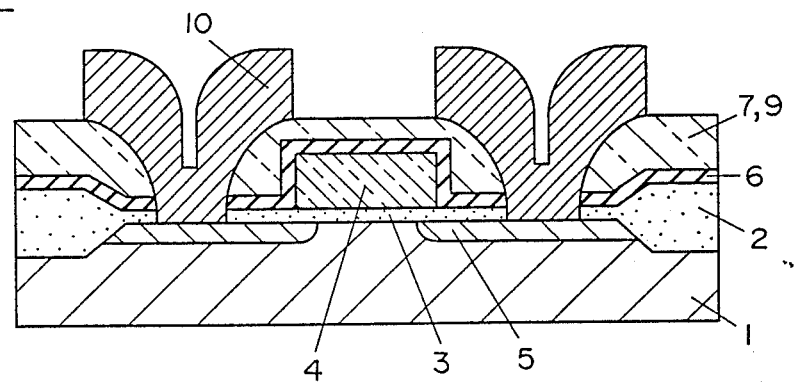

Then, an aluminum wiring 10 is formed using the well-known method as the convention method (see FIG. 1e). After completing the above processes, a MOS type integrated circuit having two interconnection layers is formed.

When the semiconductor device formed by the manufacturing method of the present invention is compared with the semiconductor device formed by the conventional method, the step coverage of the aluminum wiring is improved remarkably form 6% to 34% with respect to the opening size of 1.4×1.4 μm$^2$ of the contact hole.

When the phosporus concentration of the second BPSG film 9 is increased to 8 weight percentage, phosphorus of high concentration is diffused in the diffusion lever 5 of the contact hole section during the heat treatment (reflow process) in the succeeding process. This phenomenon causes increasing impurity concentration at the surface of N-type diffusion layer or forming an inversion layer at the surface 86 P-type diffusion layer, and thereby, especially in a CMOS type semiconductor integrated circuit, characteristics of a transistor are affected.

Incidentally, although the BPSG film 9 is explained as the second insulation film in the second embodiment, it is confirmed that the same effect can be availed when the manufacturing method described above is employed for a semiconductor device in which either of phosphosilicate glass (PSG), borosilicate glass (BSG) and arsenic silicate glass (AsSG) is used.

FIGS. 2a-2d show the manufacturing process diagram of the MOS type integrated circuit of a second embodiment of the present invention.

Figure 2A:
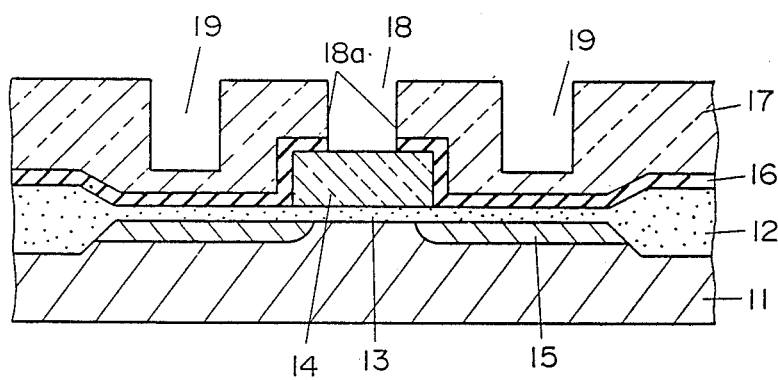
FIGS. 2a-2d cross-sectional views of the process showing the manufacturing method of the semiconductor device of a second embodiment of the present invention.

First, as shown in FIG. 2a, a MOS transistor is formed on one main side of the silicon substrate U. The MOS transistor consists of a selective oxidized film (LOCOS) 12, a gate oxidized film 13, a polycrystalline silicon gate layer 14, and a diffusion layer 15. Then a silicon nitride film 16 is heaped all over the surface of the silicon substrate. Further, 1 μm of the BPSG film 17 of 3 weight percentage of boron concentration and 1 weight percentage of phosphorus concentration, for example, is formed on the silicon nitride film 16, and the BPSG film 17 is provided with the heat treatment (flow process) in oxigen for example at 900° C. for 60 minutes in order to flatten the surface of the BPSG film 17. Following the heat treatment, the BPSG film 17 is dry-etched by using patterned resist as a mass, and thereby, a contact hole 18 is formed in the BPSG film 17 and the silicon nitride film 16 which are on the polycrystal silicon gate layer 14. At the same time, a contact hole 19 is formed in the BPSG film 17 which is above the diffusion layer is. During this process, the dry-etching treatment is completed leaving the BPSG film 17 and the silicon nitride film 16 on the bottom of the contact hole 19 formed above the diffusion layer 15 and then the resist is removed.

Figure 2B:
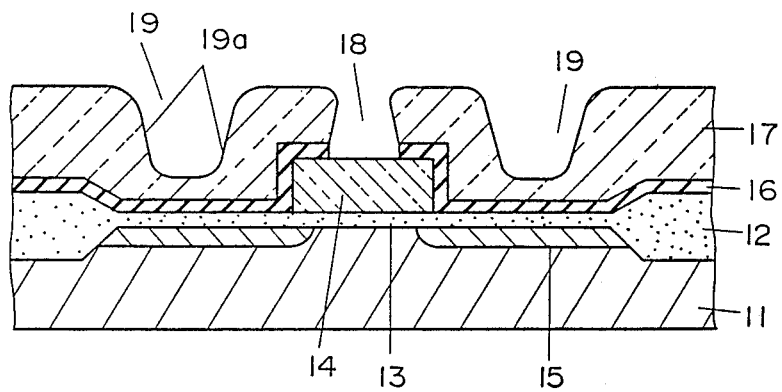
Figure 3A:
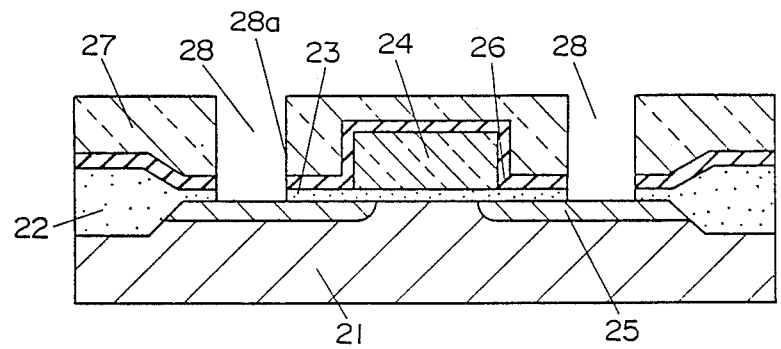
FIGS. 3a-3c are cross-sectional views of the process showing the manufacturing method of the conventional semiconductor device.
Figure 3B:
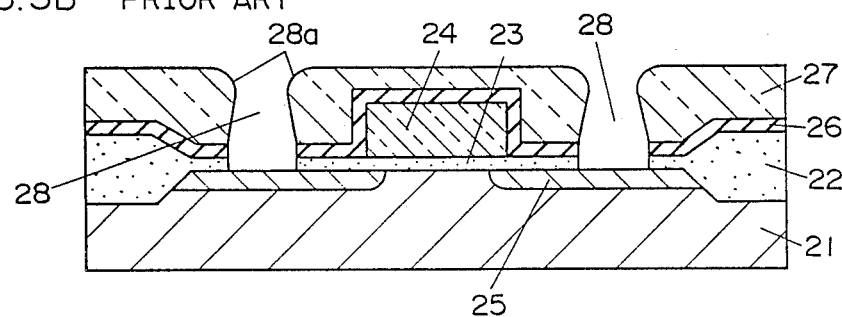
Figure 3C:
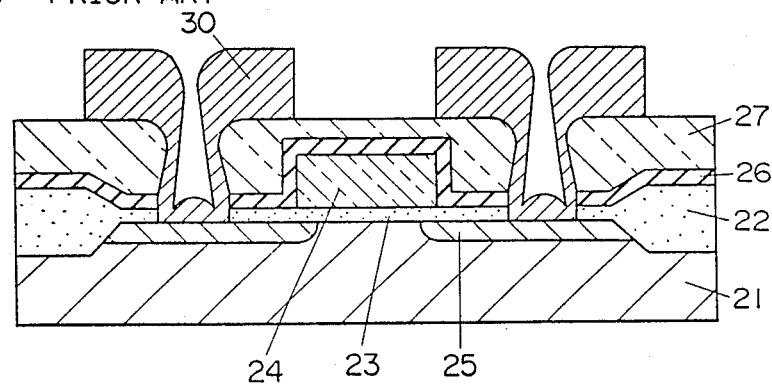

Next, as shown in FIG. 2b, thee substrate is provided with the heat treatment (reflow process) in nitrogen at 900° C. for 30 minutes. During this process, the BPSG film 17 is melted and a slope is formed on the side wall and the peripheral edge 19a of the contact hole 19. The reason why an appropriate round slope is formed on the upper and lower edges of the contact hole 19 of high aspect ratio is as follows. In the conventional method, as shown in FIG. 3a, there are interfaces between the contact hole 8 and the silicon nitride film 26 and between the contact hole 8 and the diffusion layer 25, and during the heat treatment (reflow process), tension caused by such interfaces produces on overhang at the peripheral edge of the contact hole 8. On the contrary, in this embodiment, as shown in FIG. 2a, such interfaces do not exist. Therefore, tension caused by the interfaces is eliminated and the deformation of the BPSG film 17 is accomplished appropriately. By prevention the overhang of the contact hole 19 in such manner as described above, it becomes possible to improve the coverage of the metal wiring in the contact hole 19. On the other hand, the contact hole 18 formed on the polycrystal silicone gate layer 14 produces some overhang but the coverage of the metal wiring in the contact hole 18 can be satisfactory because the aspect ratio of the contact hole is low.

Figure 2C:
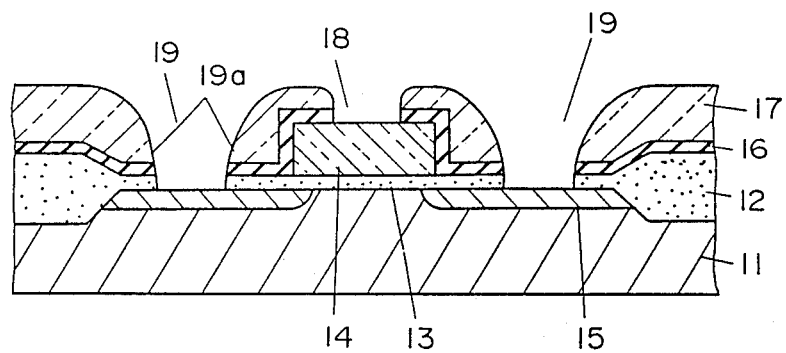
Figure 2D:
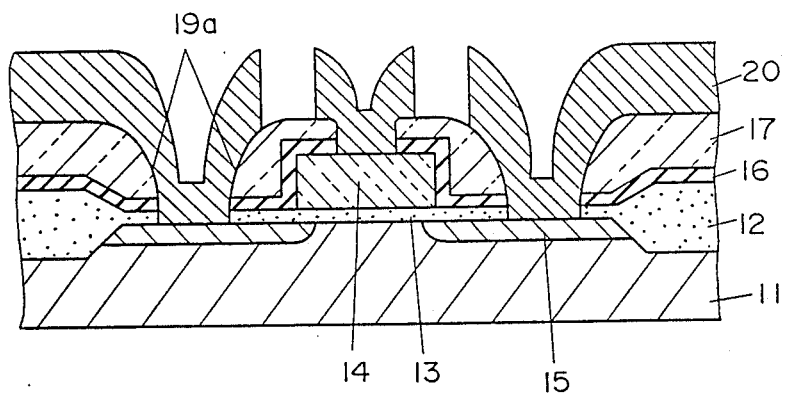

Then, as shown in FIG. 2c, the BPSG film 17 and the silicon nitride film 16 of about 200 nm thick formed on the bottom of the high aspect ratio contact hole 19 are removed by providing dry-etching all over the surface of the substrate.

Then, as shown in FIG. 1d, an aluminum wiring 20 is formed using the well-known manufacturing method as the conventional manufacturing method. Through the above processes, a MOS type integrated circuit having two interconnection layers is formed.

Furthermore, although the BPSG film 17 is explained in the second embodiment, it has been confirmed that the same effect can be availed when the manufacturing method described above is employed for the semiconductor device in which either of the phosphosilicate glass (PSG), borosilicate glass (BSG) and arsenic silicate glass (AsSG) is used.

Though the embodiment of the present invention is explained using the example of manufacturing method of a MOS type integrated circuit, the present invention can be applied to the whole semiconductor devices which require the glass reflow process.

As described above, according to the manufacturing method of the present invention, it is possible to form a slope of an appropriate shape on the peripheral edge and the side wall of the contact hole. Therefore, it is possible to prevent the breakage of metal wiring on the insulation film such as BPSG film and is effective to considerably improve the reliability of the semiconductor device.

What is claimed is:

1. A method of manufacturing a semiconductor device comprising the following steps:
    depositing a first insulation film on a semiconductor substrate in which a semiconductor element is incorporated;
    providing said first insulation film with a heat treatment in order to form a smooth surface on said first insulation film;
    forming a resist having a predetermined pattern on said first insulation film;
    forming a contact hole in said first insulation film using said resist as a mask;
    removing said resist;
    depositing a second insulation film along the surface of the shape of said semiconductor substrate which has been provided by all of said previous steps;

forming a slope on the peripheral edge and the side wall of said contact hole by a second heat treatment; and removing said second insulation film formed on the bottom of said contact hole.

2. A method of manufacturing a semiconductor device according to claim 1, wherein one of borophosphosilicate glass (BPSG), phosphosilicate glass (PSG), borosilicate glass (BSG), and arsenic silicate glass (AsSG) is used as the second insulation film.

3. A method of manufacturing a semiconductor device according to claim 1, wherein borophosphosilicate glass (BPSG) is used as the second insulation film and the phosphorus concentration of said second insulation film is less than 8 percentage by weight.

4. A method of manufacturing a semiconductor device comprising the following steps:

forming a MOS type semiconductor element which consists of a polycrystalline silicon gate layer on a gate oxidized film formed on a semiconductor substrate and a diffusion layer formed in the surface region of said semiconductor substrate adjacent to said polycrystalline silicon gate layer;

depositing an insulation film on said polycrystalline gate layer and said semiconductor substrate;

providing said insulation film with a first heat treatment so as to form a smooth surface on said insulation film;

forming a resist having a predetermined pattern on said insulation film;

forming a first contact hole which reaches said polycrystalline silicon gate layer in said insulation film within a region of said polycrystalline silicon gate layer by using said resist as a mask and forming a second contact hole in said insulation film within a region of said diffusion layer while leaving part of said insulation film on the bottom thereof;

removing said resist;

forming a slope on the peripheral edge and the side wall of said first and second contact holes by using a second heat treatment; and removing said insulation film remaining on the bottom of said second contact hole.

5. A method of manufacturing a semiconductor device according to claim 4, wherein one of borophosphosilicate glass (BPSG), phosphosilicate glass (PSG), borosilicate glass (BSG), and arsenic silicate glass (AsSG0 is used as an insulation film.

* * * * *